US007261773B2

(12) United States Patent
Mühe et al.

(10) Patent No.: US 7,261,773 B2

(45) Date of Patent: Aug. 28, 2007

(54) MELTING CRUCIBLE

(75) Inventors: Andreas Mühe, Hanau (DE); Burkhard Altekrüger, Alzenau (DE); Axel Vonhoff, Friesenheim-Oberweier (DE)

(73) Assignee: Crystal Growing Systems GmbH, Assar (DE)

( * ) Notice: Subject to any disclaimer, the term of this patent is extended or adjusted under 35 U.S.C. 154(b) by 210 days.

(21) Appl. No.: 10/927,414

(22) Filed: Aug. 26, 2004

(65) Prior Publication Data

US 2005/0275144 A1 Dec. 15, 2005

(30) Foreign Application Priority Data

Aug. 27, 2003 (DE) ................................ 103 39 402

(51) Int. Cl.
*C30B 15/20* (2006.01)

(52) U.S. Cl. .............................. 117/30; 117/32; 117/44

(58) Field of Classification Search .................. 117/18, 117/30, 32, 33, 34, 44
See application file for complete search history.

(56) References Cited

U.S. PATENT DOCUMENTS 3,396,229 A 8/1968 Sundberg
5,562,011 A * 10/1996 Bartus ...................... 74/473.24
5,891,245 A * 4/1999 Atami et al. ................ 117/213
6,077,346 A * 6/2000 Watanabe et al. ............. 117/32

FOREIGN PATENT DOCUMENTS

| | | |
|---|---|---|
| DE | 4018967 | 6/1990 |
| DE | 4200185 | 1/1992 |
| DE | 19934940 | 7/1999 |

* cited by examiner

*Primary Examiner*—Felisa Hiteshew
(74) *Attorney, Agent, or Firm*—Needle & Rosenberg, P.C.

(57) ABSTRACT

The invention relates to producing a melt that is as homogeneous as possible, to which fresh material in the form of granulate is continuously supplied. Since the granulate is cooler than the melt, heat sinks form that are especially pronounced when the granulate forms clumps in the melt. Therefore, the invention relates to a means for distributing the granulate. In one aspect, the means are inductors arranged outside the melting crucible that generate an alternating magnetic field in the melt. In this way, electrical currents are induced there that, in turn, cause the material flows. In one aspect, the inductors are arranged and controlled in such a way that a rapid distribution of the granulate is effected and thus its rapid melting. In this way, good homogeneity is achieved, especially in the center of the melt where the removal of the melted material also occurs.

8 Claims, 1 Drawing Sheet

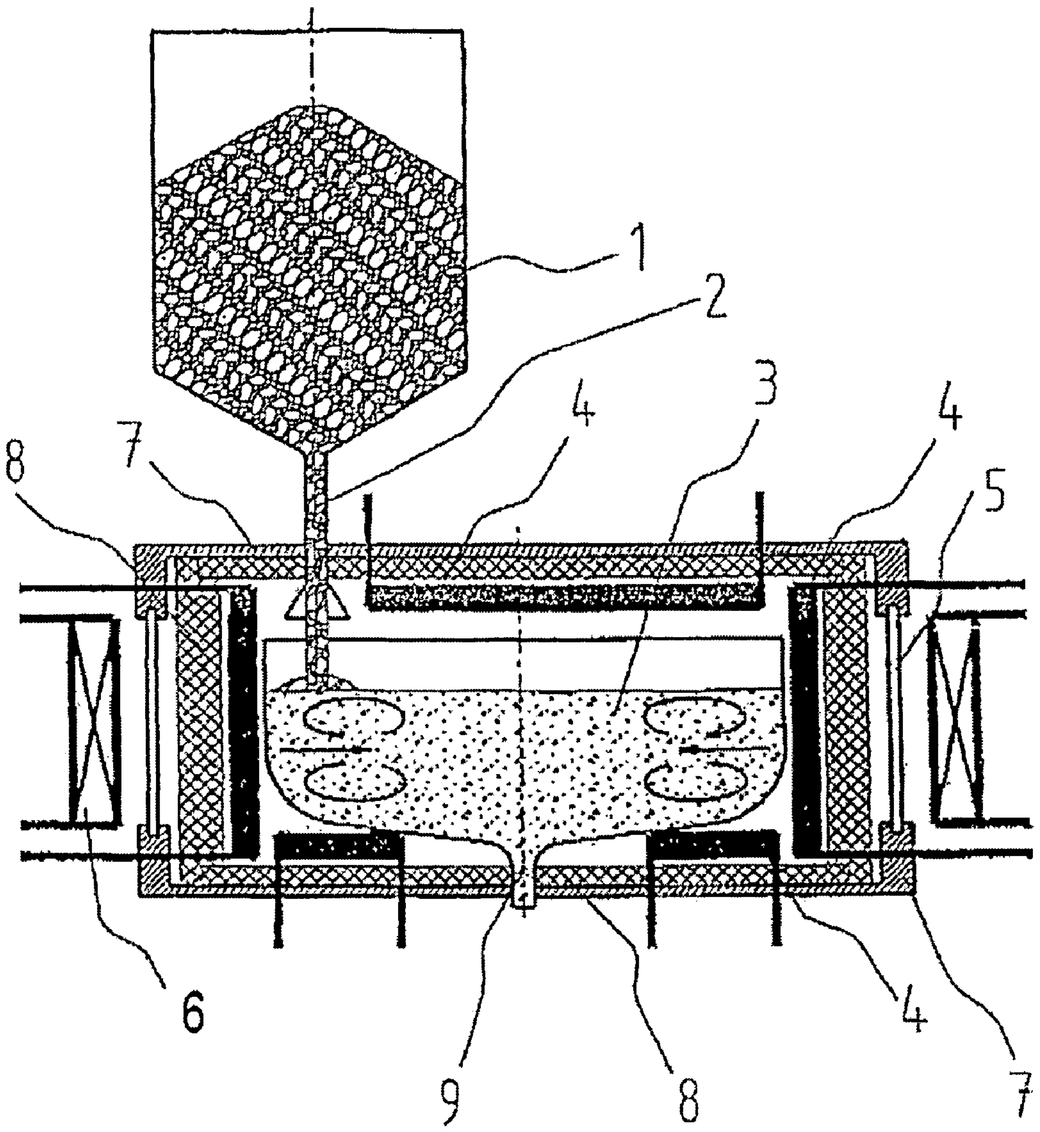
1
2
3
4
4
5
6
7
8
7
9
8
4
7

MELTING CRUCIBLE

CROSS REFERENCE TO RELATED APPLICATIONS

The present application claims priority to and the benefit of the filing date of German Application No. 103 39 402.8, filed Aug. 27, 2003, which application is incorporated herein fully by this reference.

The invention relates to a melting crucible with a granulate supply device for supplying granulate to the melt present in the melting crucible, in order to compensate the decreased volume due to the removal of melted material, whereby the addition of the granulate is carried out eccentrically to the vertical axis of the melting crucible.

Starting with a solid, polycrystalline raw material that is generally present in granulate form, a melt is created in a melting crucible for the production of monocrystalline or polycrystalline elements, rods, discs or coatings/layer. The term “granulate” is intended to comprise all forms of the raw material that can be poured.

A melting crucible with a silicon melt, from which a silicon crystal is drawn, is described in DE 42 00 185 AI.

Especially in the manufacturing of silicon crystals, silicon chips and/or silicon coatings for microelectronics and the solar industry, large quantities of silicon melt are necessary, both in continuous and in batch processes, and can be made available in a suitable and well controlled manner for the process involved. In particular, it must be possible to allow a melt to run out of a crucible continuously.

In these processes, larger quantities of a granulate of silicon or another material that is available in a device, in the form of rods, chunks or grains, must be continuously transferred into a melt with as little interference as possible. In this process, there must be no disruptions in the material flow for the production process, in either the solid or in the melted phase. This means that disruptions due to mechanical blocking of the supplied materials or due to overheating or cooling of the melt absolutely must be prevented.

Above all, initial local cooling of the melt must be prevented, since this has a more unstable and self-reinforcing effect with extremely negative consequences to the regular process because of non-homogeneous material and/or energy distribution.

In addition, at no point can there be a bottleneck and overflow of the material flow, or insufficient supply or interruption of the production process.

While this is being accomplished, for economic reasons, these requirements must be solved with the lowest possible technological expense.

The solutions known to date exhibit either considerable problems due to a number of disruptions of the melting process, e.g. overheating/cooling/disruption of the material flow, etc. or they require high and costly additional mechanical effort in order to prevent these types of disruption. Along with this is the fact that additional mechanical equipment itself is susceptible to disruption and involves an additional risk of disruption and failure.

The invention is thus based on the problem of designing a melting crucible according to the preamble of claim 1 with the lowest possible technological effort in such a way that the named disruptions do not occur, especially in the melt.

To solve the problem, the invention provides that the granulate supply device consists of at least one supply reservoir, which has at least one supply tank that is arranged eccentrically to the vertical axis of the melting crucible and above the melt and that inductors are present to generate alternating magnetic fields in the melt, whereby the inductors are arranged outside the melting crucible in such a way that the magnetic alternating fields generated by the inductors cause material flows in the melt, which lead to a rotation of the melt around the vertical axis of the melting crucible.

Because of this rotation, the granulate is distributed uniformly on the periphery of the liquid level of the melt and absorbs the heat of the melt there. Since the individual granulate particles are thus relatively widely spaced, no granulate clumping can occur.

The melting of the cold granulate supplied through the chute thus does not occur at only one place in the melting crucible. It is much more the case that the granulate supplied is distributed over the entire circumference of the melt bath, which also considerably increases the effectiveness of the melting process.

Because of this, no local clumps occur in which the cold granulate that is present in clumps functions as a heat sink that would considerably disrupt the energy distribution in the melt, which in turn would have a negative effect on the processes following the melting.

The granulate supply device can also consist here of several chutes that are arranged radially at a distance from the vertical center axis of the melt and above the melt.

In this way, a better distribution of the supplied granulate is achieved by several granulate supply devices distributed around the circumference of the melting crucible.

Thus according to the invention, in an advantageous manner, the melting of the granulate that is brought in at one or more locations is supported by an electromagnetically-driven, forced convection of the melting bath.

Because of this a considerably better, faster and more uniform transfer of the heat energy to the granulate to be melted is achieved. The magnetic alternating fields for driving a forced convection in the melt are generated here by an arrangement of inductors and/or coils that surround the melting crucible.

Depending on the application involved, it may be advantageous to arrange these inductors inside the process chamber bordered by a tank.

In an especially advantageous embodiment, the electrical energy for generating the heating power that would be necessary anyway for the melting can be used simultaneously to produce a suitable magnetic field for driving the forced convection. This is possible in various ways: the resistance heaters that are already present can thus function as inductors.

According to this, one or more resistance heaters operating with single-phase alternating current/AC can be designed as inductors. The alternating magnetic field generated by these causes a forced convection of the melt in the center, outward from the inductor by way of the Lorenz force.

The layout can be further improved in that at least three inductors are arranged over each other around the melting crucible and connected to a three-phase alternating current source, whereby a migrating magnetic field forms, which forces the melt into a convection with a movement of the material toward the center of the melting crucible.

The heating devices designed as inductors can also be arranged and operated with three-phase rotary current in such a way that a rotating magnetic field forms, which brings the melt into a rotation around a vertical axis.

The penetration of the electromagnetic field into the melt can be influenced by the selection of the alternating field frequency. In an embodiment that is especially technically advantageous, the inductors and coils and/or the resistance heaters designed as inductors can also be operated with the available network frequency, 50 Hz to 60 Hz.

The advantages of an electromagnetically forced convection during continuous melting of semiconductor materials or other materials consist here in that a melting free of disruptions and a largely homogeneous distribution of the thermal energy in the melted material can be achieved without any additional mechanical effort being necessary for this, e.g. melting crucible rotation, multiple feeds, deflector or rebound elements. The desired and necessary improvement of the melting process may thus be achieved by the use of electromagnetic effects only.

In this way, increased reliability and consistency of the melting process can be achieved. Disruptions due to mechanical causes are eliminated, since additional mechanical components and/or mechanical movements, e.g. melting crucible rotation, are not necessary.

As explained, in a special embodiment for generation of the alternating electromagnetic fields, even additional inductors can be dispensed with, in that the heating device that is already present anyway is designed and used as an inductor. In this process, an AC heater power supply simultaneously supplies power for the producing the alternating magnetic fields so that in this way, a solution is possible that can be implemented especially economically.

The invention particularly comes to bear if a tapping point for the melted material is present in the floor of the melting crucible, at its center or near to it. As explained above, a mixing and melting of the granulate in the periphery of the melting crucible occurs in this process, so that a homogenous melt develops toward the center of the melting crucible and can then be removed at the tapping point arranged there. It is especially easy to optimize the arrangement of the inductors and/or heaters in a case such as this; but optimum inductor and/or heater arrangements can be found, even for a decentralized removal of the melt at the periphery of the crucible.

The homogeneity of the melt can be improved if a heating element or heating device surrounds the melting crucible in the circumferential direction and an additional heating element is arranged above the liquid level of the melt.

In the following, the invention will be explained in more detail using an embodiment example. The single FIGURE shows, in cross section, a rotation-symmetrical melting crucible that is surrounded by heating elements and inductors 6 and has a granulate supply device.

The device consists of a supply tank 1—also called a hopper—for a granulate (especially silicon granulate), of a melting crucible 3 with a controllable heating device 4 and a controllable granulate supply device 2 from the supply tank 1 to the melting crucible 3, whereby the chute of the supply tank 1 is arranged eccentrically. The device also consists of a controllable melt outlet 9, arranged centrally to the melting crucible 3, from the melting crucible 3 to the process room. The parts of the melting equipment are surrounded by a thermal insulation 8 and housed in a housing 7, formed of a floor and cover part and of a cylindrical shroud part 5.

An important requirement of such a device consists in that there must be provision of a supply of thermal energy for the melting process, which is as efficient as possible and also as homogeneous as possible, without the occurrence of local overheating or excess cooling or other disruptions of the material flow. This problem is not trivial for the necessary material flows, melting rates, heating powers and dimensions of the melting equipment.

Therefore it is suggested, as shown in FIG. 1, that the heating equipment surround the melting crucible 3 on all sides as much as possible. In particular, it is suggested that a heating element be placed above the melting crucible 3, which then can very effectively transfer its power by radiation to the granulate that is still cold at first.

As soon as a melt is present, cold material in the form of granulate or in another pourable form is supplied from the supply tank 1, according to the removal quantity at the melt outlet 9, this cold material first collecting on the periphery of the melt in order to then be distributed on the melt, whereby it gradually melts. So that clumping of the granulate does not occur, the inductors 6 are arranged and controlled in such a way that a rotating flow develops around the vertical axis of the melting crucible, so that a uniform distribution of the granulate on the periphery of the melt surface occurs, since the material that at first still floats on the melt and is not yet melted is carried along by the rotating melt. The arrangement of the inductors 6 that is necessary for this may differ from the cylindrical shape that is shown.

In order to obtain the most homogeneous melt possible, selective convections are generated in the melt. Inductors 6, which generate an alternating magnetic field that extends into the melt are used for this. These fields induce electrical currents in the melt that are linked with material transport. Because of another suitable control of the inductors 6 that is superimposed on the above mentioned control, flows in the direction of the center of the melt, e.g. in a center plane of the melting crucible 3 can be generated, whereby the material that is thereby transported is carried back, under and over this plane, due to countercurrents. Thus toroid-shaped circulation zones develop in the periphery of the melt.

The single FIGURES thus shows a continuous preparation of a melt created from a granulate for a continuous crystallization process. However, the invention is not limited to this embodiment example alone.

REFERENCE LIST

1 Supply tank
2 Granulate supply device
3 Melting crucible
4 Heating device
5 Cylindrical shroud part
6 Inductor
7 Housing
8 Thermal insulation
9 Melt outlet

The invention claimed is:

1. A granulate supply device for supplying granulate into the melt of a melting crucible to compensate for a decreased volume due to the removal of melted material, whereby addition of the granulate is carried out eccentrically to a vertical axis of the melting crucible, the granulate supply device comprising:

a supply tank with at least one chute arranged eccentrically to the vertical axis of the melting crucible and above the melt; and inductors for generating magnetic alternating fields in the melt, wherein the inductors are arranged outside the melting crucible in such a way that material flows are caused in the melt by the alternating magnetic fields generated by the inductors and lead to a rotation of the melt around the vertical axis of the melting crucible.

2. The granulate supply device of claim 1 further comprising a plurality of chutes at a distance radially from the vertical center axis of the melt and above the melt.

3. The granulate supply device of claim 2, wherein each chute is connected with a supply tank assigned to it.

4. The granulate supply device of claim 2, wherein a plurality of chutes are connected to a single supply tank by way of a distributor.

5. The granulate supply device of claim 1, wherein the melting crucible comprises a heating device that is designed in such a way that it also functions as an inductor.

6. The granulate supply device of claim 5, wherein the heating device comprises at least one heating element that surrounds the melting crucible in the circumference direction and, wherein additional heating element is arranged above the liquid level of the melt.

7. The granulate supply device of claim 1, wherein at least three inductors are arranged over each other around the melting crucible and are connected to a three-phase alternating current source.

8. The granulate supply device of claim 7, wherein the frequency of the alternating current is about 50 Hz to about 60 Hz.

* * * * *